(12) United States Patent
Fernandez

(10) Patent No.: US 7,659,620 B2
(45) Date of Patent: Feb. 9, 2010

(54) INTEGRATED CIRCUIT PACKAGE EMPLOYING A FLEXIBLE SUBSTRATE

(75) Inventor: Elstan Anthony Fernandez, Singapore (SG)

(73) Assignee: Infineon Technologies, AG, Munich (DE)

( * ) Notice: Subject to any disclaimer, the term of this patent is extended or adjusted under 35 U.S.C. 154(b) by 403 days.

(21) Appl. No.: 11/287,859

(22) Filed: Nov. 28, 2005

(65) Prior Publication Data

US 2006/0076655 A1 Apr. 13, 2006

Related U.S. Application Data

(63) Continuation of application No. PCT/SG03/00125, filed on May 28, 2003.

(51) Int. Cl.
*H01L 23/488* (2006.01)
(52) U.S. Cl. ............... 257/736; 257/E21.476
(58) Field of Classification Search ......... 257/686, 257/777, 734–738, E21.476
See application file for complete search history.

(56) References Cited

U.S. PATENT DOCUMENTS

| | | | |
|---|---|---|---|
| 5,222,014 A | 6/1993 | Lin | |
| 5,291,061 A | 3/1994 | Ball | |
| 5,323,060 A | 6/1994 | Fogal et al. | |
| 5,438,224 A | 8/1995 | Papageorge et al. | |
| 5,477,082 A | 12/1995 | Buckley, III et al. | |
| 5,748,452 A | 5/1998 | Londa | |
| 5,869,356 A * | 2/1999 | Fuller et al. | 438/126 |
| 5,973,396 A | 10/1999 | Farnworth | |
| RE36,613 E | 3/2000 | Ball | |
| 6,057,598 A | 5/2000 | Payne et al. | |
| 6,100,804 A * | 8/2000 | Brady et al. | 340/572.7 |
| 6,207,467 B1 | 3/2001 | Vaiyapuri et al. | |
| 6,326,696 B1 | 12/2001 | Horton et al. | |
| 6,365,963 B1 | 4/2002 | Shimada | |
| 6,395,582 B1 | 5/2002 | Sohn et al. | |
| 6,515,356 B1 * | 2/2003 | Shin et al. | 257/678 |
| 6,678,167 B1 | 1/2004 | Degani et al. | |
| 6,746,894 B2 * | 6/2004 | Fee et al. | 438/106 |
| 6,784,530 B2 * | 8/2004 | Sugaya et al. | 257/686 |
| 6,867,486 B2 * | 3/2005 | Hong | 257/686 |
| 6,982,485 B1 * | 1/2006 | Lee et al. | 257/737 |
| 7,198,980 B2 * | 4/2007 | Jiang et al. | 438/107 |
| 7,274,095 B2 * | 9/2007 | Fee et al. | 257/680 |
| 2001/0048591 A1 | 12/2001 | Fjelstad et al. | 361/767 |
| 2002/0180040 A1 | 12/2002 | Camenforte et al. | |
| 2003/0234452 A1 * | 12/2003 | Tao et al. | 257/777 |

FOREIGN PATENT DOCUMENTS

| | | |
|---|---|---|
| EP | 1 122 786 A2 | 8/2001 |
| JP | 11-251483 | 9/1999 |

* cited by examiner

*Primary Examiner*—Nathan W Ha
(74) *Attorney, Agent, or Firm*—Slater & Matsil, L.L.P.

(57) ABSTRACT

An integrated circuit package includes a flexible laminar substrate 1. The substrate 1 has a flexible layer 5 of heat conductive material on one of its faces. The layer 5 extends across an aperture 9 in the flexible substrate 1. A first integrated circuit 11 is mounted on the layer 5 within the aperture 9, and wire bonded to the substrate 1. A flip chip 21 is mounted on the first integrated circuit 11. The two integrated circuits 11, 21 are embedded in a resin body 23.

27 Claims, 2 Drawing Sheets

INTEGRATED CIRCUIT PACKAGE EMPLOYING A FLEXIBLE SUBSTRATE

This application is a continuation of co-pending International Application No. PCT/SG2003/000125, filed May 28, 2003, which designated the United States and was published in English, which application is incorporated herein by reference.

TECHNICAL FIELD

Embodiments of the present invention relate to methods of packaging integrated circuits using a flexible substrate, and to integrated circuit packages produced using the method.

BACKGROUND

It is well known to provide integrated circuit packages in which integrated circuits (dies), principally composed of semiconductor material, are located within resin bodies. Electrical contacts of the integrated circuit are electrically in contact with corresponding electrical conductors that protrude out of the resin body.

In one type of package, the integrated circuits are located on a die pad portion of a lead frame with the electric contacts facing away from the lead frame, and wires are formed between the electric contacts and respective lead fingers of the lead frame. The resin is applied to encase the integrated circuits and the wires in the resin body, leaving a portion of the lead frames protruding from the resin body. The lead fingers are then cut to separate them from the remainder of the lead frame, and thus singulate the packages.

An alternative type of integrated circuit is called a "flip-chip," which is positioned on (and normally adhered to) a substrate with the electrical contacts facing the substrate, and in electrical contact with corresponding electric contacts provided in the substrate. The electric contacts on the substrate are typically electrically connected to electrically conductive paths formed through the material of the substrate. The flip-chip is typically encased in a resin body which secures it to the substrate to form a package.

There is pressure to improve integrated circuit packages to increase the number of input/output connections (I/Os), reduce the package footprint, reduce the package thickness and improve the thermal management (that is, reduce the risk of the integrated circuit overheating).

Various proposals have been made to do this, typically proposing that a plurality of dies are packaged into a single package. For example, it is known to provide a plurality of dies inside a single package stacked one above the other with an adhesive paste between them. It is further known to provide two dies placed side-by-side (e.g., on a lead frame) within a single resin body.

One disadvantage with providing a stacked die package assembly is that the thickness of the package is increased. Additionally, there are reliability concerns due to the reduced possibilities for heat dissipation, which in turn lead to an increased risk of overheating.

Conversely, providing the dies side-by-side means that the footprint of the package is increased.

A separate development in the field of packaging is to employ flexible substrates, that is substrates consisting of an element of flexible material onto which an integrated circuit can be mounted, and carrying electrically conductive paths for electrical connection to electric contacts of the integrated circuit, e.g., by the wire-bonding or flip-chip techniques. The preferred base material for flexible substrates is polyimide, although other materials (such as polyester, fluorocarbon films, aramid papers, and composites) are also known. These are quite different from the materials used to make conventional substrates. There are numerous advantages in providing flexible substrates to help in the miniaturization of electronic products. For example, if the substrate is flexible, the product is less likely to be sensitive to variations in temperature, since the substrate can absorb heat shrinkage or expansion of components of the product.

SUMMARY OF THE INVENTION

In general terms, the embodiment of the present invention provides a package in which a flexible laminar substrate has a flexible layer of heat conductive material on one of its faces. The layer extends across an aperture in the flexible substrate, and two or more integrated circuits are stacked onto the layer in this region, on the same side of the layer as the substrate, with electrical contacts of the integrated circuits connected to circuitry on the substrate.

The presence of the heat conductive material means that heat can be easily conducted away from the stacked integrated circuits.

Since the integrated circuits are mounted in the aperture in the substrate, the thickness of the package in the region of the integrated circuits does not depend upon the thickness of the flexible substrate. Thus, the advantages of a stacked package (reduced integrated circuit footprint compared to a side-by-side arrangement) can be achieved with a reduced penalty in terms of the thickness of the package.

Since both the heat conductive material and the substrate are flexible, the combination is flexible also, providing the advantages of a flexible substrate. In particular, the size of the electronic device in which the completed package is used can be reduced more easily.

The lower integrated circuit of the stack is preferably bonded to the substrate by wire bonding. This minimizes wire sweep problems commonly seen in stacked die or side-by-side die placement due since the long wires and/or awkward angles of conventional wire bonding can be ameliorated. This is because in the embodiment of the invention the upper surface of the bottom die tends to be about the same height as the top surface of the substrate, so low loop bonding is possible, which is a key advantage for molding to avoid wire-sweep and wire shorting.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

An embodiment of the invention will now be described for the sake of example only with reference to the following figures in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
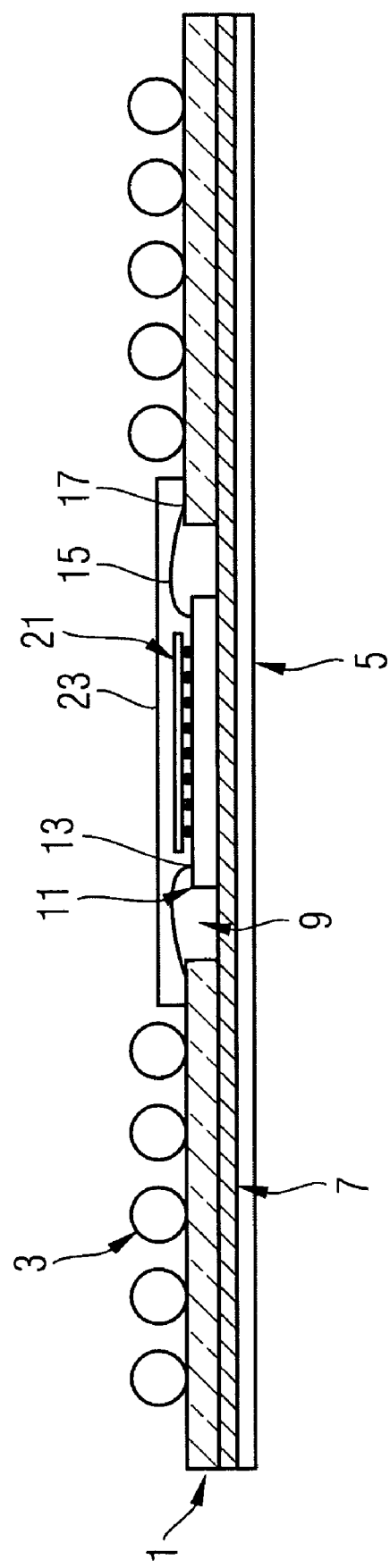
FIG. 1 is a cross-sectional view of the embodiment of the invention.

Referring first to FIG. 1, the embodiment of the invention is shown as being a package composed of a substrate 1, which is laminar and composed of a flexible material. The substrate material is preferably polyimide, but alternatively can be any other material such as olyester, fluorocarbon films, aramid papers, and composites. The upper surface of the substrate 1 (as shown in FIG. 1) is provided with eutectic solder balls 3.

On one face of the substrate 1 (the lower face, as shown in FIG. 1; i.e., the side opposite the solder balls 3), is mounted a layer 5 of heat-conductive material. The material may be copper or aluminum. The thickness of the material varies from one application to another, but it is typically in the range of about 2 mm to about 5 mm. The thickness of the layer 5 is great enough for there to be little or no risk of it tearing during a packaging process as described below. The layer 5 is attached to the substrate 1 using a layer of heat-conductive adhesive 7. The adhesive 7 may be of ACP (anisotropic conductive paste) or an ACF (anisotropic conductive film), and may be the materials commonly referred to as TS333LD or QMI 5065.

The substrate 1 is pre-formed with a square aperture 9, so that in this region the substrate 1 does not cover the layer 5. The size of the aperture will be different according to which integrated circuits are to be packaged, but is wider than the dimensions of the integrated circuits in each direction.

In a first step of the packaging procedure, a first integrated circuit (die) 11 is placed onto the exposed region of the layer 5 within the aperture 9, and bonded there by the adhesive 7.

The integrated circuit 11 has electric contacts 13 around the periphery of its surface that faces away from the layer 5. In a second step, these electric contacts 13 are wire bonded by wire bonds 15 (which are typically made of gold) to corresponding electric contacts 17 on the upper surface of the substrate 1 (i.e., the surface that faces away from the layer 5). These electric contacts 17 are electrically connected to the circuitry of the substrate 1 for electrically connecting the contacts 13 to other electrical components.

Figure 2:
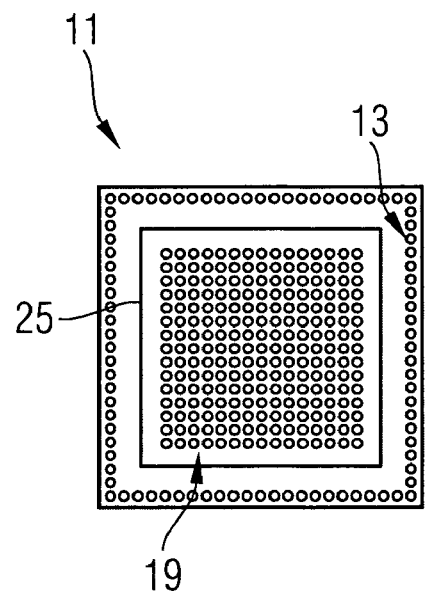
FIG. 2 is a top view of one integrated circuit for use in the embodiment.
Figure 3:
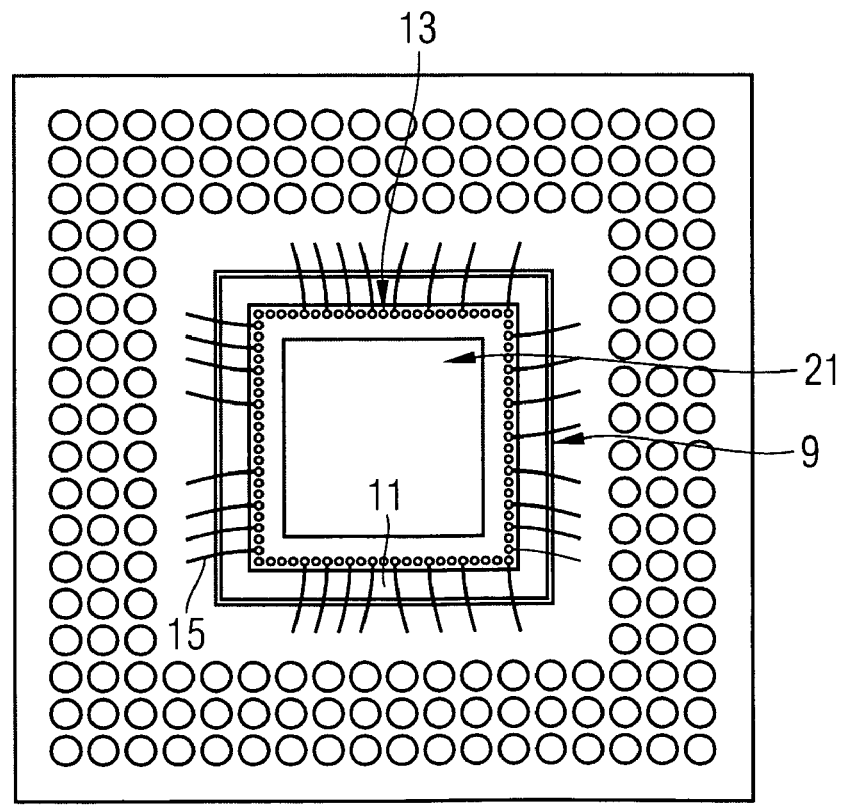
FIG. 3 is a top view of the embodiment of the invention.

FIG. 2 is a top view of the first integrated circuit 11. In addition to the electric contacts 13, the upper surface of the first integrated circuit 11 includes a second set of electric contacts 19, which are radially inward of the electric contacts 13.

In a third step of the method (which may optionally be performed before the second step), a second integrated circuit 21 is mounted onto the upper surface of the first integrated circuit 11. It has the footprint 25 shown in FIG. 2. The second integrated circuit is a flip-chip, of a conventional design, having an array of electrical contacts on its lower surface. When the second integrated circuit 21 is mounted on the first integrated circuit 11, these contacts are in register with corresponding ones of the electric contacts 13. The mounting of the second integrated circuit 21 onto the first integrated circuit 11 may employ any known flip-chip mounting method, for example employing a layer of ACP (anisotropic conductive paste) or an ACF (anisotropic conductive film) between the two surfaces. Alternatively, an underfill layer can be used in the mounting procedure.

In a fourth step of the method, the aperture 9 of the substrate 1 is filled with a body 23 of resin material, by a molding operation conducted by placing the substrate 1 and its attached components into a suitably shaped mold, and allowing liquid resin to flow into the mold, and subsequently curing the resin.

Since the integrated circuits 11, 21 are mounted on the heat conductive layer 5, dispersion of heat generated within them is good. Thus, the embodiment has a reduced risk of overheating compared to existing packages with stacked integrated circuits.

Additionally, since the integrated circuits 11, 21 are located within the aperture 9, the thickness of the package may be less than the sum of the thickness of the substrate 1 and the integrated circuits 11, 21, unlike conventional mounting techniques.

Furthermore, this is achieved while still allowing the substrate 1 to be flexible, thus obtaining the advantages of a flexible substrate packaging technique.

Although the invention has been explained above with reference to only a single embodiment, many variations within the scope of the invention are possible, as will be clear to a person skilled in the art. For example, many techniques are known for forming stacks of integrated circuits, and any of these techniques is applicable to the stacking of integrated circuits onto the exposed portion of the layer 5. For example, it is not necessary that the second integrated circuit 21 should be a flip-chip. Instead, or additionally, the integrated circuit may have electric contacts on its upper surface, which are wire bonded to corresponding electric contacts on the substrate 1, for connecting the second integrated circuit directly to the circuitry of the substrate 1.

Furthermore, the stack of integrated circuits may include additional integrated circuits, as in known stacking techniques. For example, another flip-chip could be mounted onto the second integrated circuit 21, with electrical contacts electrically connected to upwardly facing contacts (not shown) of the second integrated circuit 21.

What is claimed is:

1. An integrated circuit package comprising:
   a flexible substrate including an aperture;
   a flexible layer of heat conductive material on one face of the flexible substrate;
   an adhesive between the flexible substrate and the flexible layer of heat conductive material, wherein the flexible substrate, the flexible layer of heat conductive material and the adhesive form a flexible material combination; and
   two or more integrated circuits stacked within the aperture.

2. The integrated circuit package according to claim 1, wherein the two or more integrated circuits include a first integrated circuit having first electric contacts that are wire bonded to electric contacts of the substrate.

3. The integrated circuit package according to claim 2, wherein the first integrated circuit further includes second electrical contacts over a surface directed away from the flexible layer, the two or more integrated circuits further including a flip-chip mounted on the first integrated circuit, electric contacts of the flip-chip being in register with the second electrical contacts of the first integrated circuit.

4. The integrated circuit package according to claim 1, wherein the flexible layer of heat conductive material extends across the aperture in the flexible substrate, the two or more integrated circuits being mounted within the aperture over the flexible layer of heat conductive material.

5. The integrated circuit package according to claim 4, wherein the two or more integrated circuits are adhered to the flexible layer of heat conductive material with an adhesive.

6. The integrated circuit package according to claim 4, wherein the two or more integrated circuits include a first integrated circuit having first electric contacts that are wire bonded to electric contacts of the substrate.

7. The integrated circuit package according to claim 6, wherein the two or more integrated circuits further include a second integrated circuit, the second integrated circuit including a plurality of contacts that are flip-chip mounted over contacts on a surface of the first integrated circuit.

8. The integrated circuit package according to claim 7, wherein the first electric contacts of the first integrated circuit are disposed at a periphery of the surface.

9. The integrated circuit package according to claim 1, wherein the flexible substrate comprises polyimide.

10. The integrated circuit package according to claim 1, wherein the flexible substrate comprises a material selected from the group consisting of polyester, fluorocarbon films, and aramid papers.

11. The integrated circuit package according to claim 1, wherein the flexible layer of heat conductive material comprises copper.

12. The integrated circuit package according to claim 1, wherein the flexible layer of heat conductive material comprises aluminum.

13. The integrated circuit package according to claim 1, wherein the two or more integrated circuits are stacked on the flexible layer in register with the aperture.

14. An integrated circuit package comprising:
a flexible laminar substrate including an aperture;
a flexible layer of heat conductive material over a first face of the flexible laminar substrate, the flexible layer of heat conductive material adjacent the aperture;
an adhesive between the flexible laminar substrate and the flexible layer of heat conductive material, wherein the flexible laminar substrate, the flexible layer of heat conductive material and the adhesive form a flexible material combination;
a plurality of solder balls over a second face of the substrate;
a first integrated circuit aligned with the aperture, the first integrated circuit having first contacts electrically coupled to the solder balls; and
a second integrated circuit stacked over the first integrated circuit, the second integrated circuit electrically coupled to second contacts of the first integrated circuit.

15. The integrated circuit package of claim 14, wherein:
the first contacts of the first integrated circuit are wire bonded to contact pads of the flexible laminar substrate, the contact pads being electrically coupled to the solder balls; and
the second contacts of the first integrated circuit are disposed in alignment with contacts on the second integrated circuit, the second integrated circuit being flip-chip mounted on the first integrated circuit.

16. The integrated circuit package of claim 15, wherein the flexible laminar substrate comprises a polyimide laminar substrate.

17. A method of a plurality of integrated circuits, the method comprising:
providing a flexible substrate that includes an aperture;
attaching a flexible layer of heat conductive material to one face of the flexible substrate, the flexible layer of heat conductive material being attached to the flexible substrate with an adhesive, wherein the flexible substrate, the flexible layer of heat conductive material and the adhesive form a flexible material combination; and
mounting a stack of two or more integrated circuits over a region of the flexible layer that is in register with the aperture.

18. The method according to claim 17, wherein the stack of integrated circuits includes a first integrated circuit, the method further comprising wire bonding first electric contacts of the first integrated circuit to electric contacts of the flexible substrate.

19. The method according to claim 18, wherein the first integrated circuit further includes second electrical contacts directed away from the flexible layer, and the stack of integrated circuits further includes a flip-chip, the method further comprising mounting the flip-chip on the first integrated circuit with electric contacts of the flip-chip in register with the second electrical contacts of the first integrated circuit.

20. The method according to claim 17, wherein the flexible substrate comprises a laminar polyimide substrate.

21. The method according to claim 17, wherein the flexible layer of heat conductive material comprises copper or aluminum.

22. The method according to claim 17, wherein attaching the flexible layer of heat conductive material to one face of the flexible substrate comprises providing the adhesive material between the flexible substrate and the flexible layer.

23. An integrated circuit package comprising:
a flexible substrate including an aperture;
a flexible layer of heat conductive material on one face of the flexible substrate, wherein the flexible substrate and the flexible layer of heat conductive material form a flexible material combination and wherein the flexible layer comprises a copper layer or an aluminum layer; and
two or more integrated circuits stacked within the aperture.

24. The integrated circuit package according to claim 23, further comprising an adhesive between the flexible substrate and the flexible layer of heat conductive material.

25. An integrated circuit package comprising:
a flexible substrate including an aperture;
a flexible layer of heat conductive material on one face of the flexible substrate;
an adhesive between the flexible substrate and the flexible layer of heat conductive material, wherein the flexible substrate, the flexible layer of heat conductive material and the adhesive form a flexible material combination and wherein the flexible layer of heat conductive material extends across the aperture in the flexible substrate; and
two or more integrated circuits mounted within the aperture over the flexible layer of heat conductive material.

26. The integrated circuit package according to claim 25, further comprising an adhesive layer between the flexible substrate and the flexible layer.

27. The integrated circuit package according to claim 26, wherein the adhesive layer extends across the aperture so that the two or more integrated circuits are mounted over the adhesive layer.

* * * * *

UNITED STATES PATENT AND TRADEMARK OFFICE
CERTIFICATE OF CORRECTION

| | | |
|---|---|---|
| PATENT NO. | : 7,659,620 B2 | Page 1 of 1 |
| APPLICATION NO. | : 11/287859 | |
| DATED | : February 9, 2010 | |
| INVENTOR(S) | : Fernandez | |

It is certified that error appears in the above-identified patent and that said Letters Patent is hereby corrected as shown below:

In Col. 5, line 56, claim 17, before a insert --packaging--.

Signed and Sealed this

Eighth Day of June, 2010

David J. Kappos
*Director of the United States Patent and Trademark Office*